(12) United States Patent
Hara

(10) Patent No.: US 7,973,363 B2
(45) Date of Patent: Jul. 5, 2011

(54) IGBT SEMICONDUCTOR DEVICE

(75) Inventor: Masafumi Hara, Aichi-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 12/741,622

(22) PCT Filed: Nov. 5, 2008

(86) PCT No.: PCT/JP2008/070109
§ 371 (c)(1),
(2), (4) Date: May 6, 2010

(87) PCT Pub. No.: WO2009/060852
PCT Pub. Date: May 14, 2009

(65) Prior Publication Data
US 2010/0224907 A1    Sep. 9, 2010

(30) Foreign Application Priority Data

Nov. 7, 2007 (JP) .................................. 2007-289536

(51) Int. Cl.
H01L 29/76 (2006.01)
H01L 29/94 (2006.01)
H01L 29/74 (2006.01)
(52) U.S. Cl. .. 257/341; 257/138; 257/327; 257/E29.027
(58) Field of Classification Search .................. 257/341, 257/328, 138, 327, 139, E29.027, E29.013
See application file for complete search history.

(56) References Cited

U.S. PATENT DOCUMENTS

| | | | |
|---|---|---|---|
| 6,323,509 B1 * | 11/2001 | Kusunoki | 257/146 |
| 7,629,626 B1 * | 12/2009 | Suekawa | 257/170 |
| 2001/0028083 A1 | 10/2001 | Onishi et al. | |

(Continued)

FOREIGN PATENT DOCUMENTS

EP    0 600 241    6/1994

(Continued)

OTHER PUBLICATIONS

Extended European Search Report dated Oct. 19, 2010 for EP Appl. No. 08848331.8.

Primary Examiner — Shouxiang Hu
(74) Attorney, Agent, or Firm — Finnegan, Henderson, Farabow, Garrett & Dunner, LLP

(57) ABSTRACT

To provide a semiconductor device in which dielectric breakdown strength in a peripheral region is increased without increasing on-resistance. An IGBT comprises a body region, guard ring, and collector layer. The body region is formed within an active region in a surface layer of a drift layer. The guard ring is formed within a peripheral region in the surface layer of the drift layer, and surrounds the body region. The collector layer is formed at a back surface side of the drift layer, and is formed across the active region and the peripheral region. A distance F between a back surface of the guard ring and the back surface of the drift layer is greater than a distance between a back surface of the body region and the back surface of the drift layer. A thickness H of the collector layer in the peripheral region is smaller than a thickness D of the collector layer in the active region.

7 Claims, 2 Drawing Sheets

U.S. PATENT DOCUMENTS

| | | |
|---|---|---|
| 2002/0048855 A1 | 4/2002 | Matsudai et al. |
| 2002/0167020 A1 | 11/2002 | Iwamoto et al. |
| 2003/0168718 A1 | 9/2003 | Matsudai et al. |
| 2004/0065921 A1 | 4/2004 | Iwamoto et al. |
| 2004/0124465 A1 | 7/2004 | Onishi et al. |
| 2004/0164347 A1* | 8/2004 | Zhao et al. ............... 257/328 |
| 2004/0238884 A1* | 12/2004 | Tanaka et al. ............. 257/341 |
| 2005/0017292 A1 | 1/2005 | Onishi et al. |
| 2006/0208334 A1 | 9/2006 | Yamauchi et al. |
| 2006/0278925 A1* | 12/2006 | Yamaguchi ............... 257/341 |
| 2007/0052014 A1* | 3/2007 | Takahashi ................. 257/330 |
| 2008/0093697 A1* | 4/2008 | Kaneda et al. ............ 257/492 |

FOREIGN PATENT DOCUMENTS

| | | |
|---|---|---|
| JP | 6-140633 | 5/1994 |
| JP | 8-102536 | 4/1996 |
| JP | 11-40822 | 2/1999 |
| JP | 2001-144096 | 5/2001 |
| JP | 2001-298190 | 10/2001 |
| JP | 2002-110985 | 4/2002 |
| JP | 2002-343967 | 11/2002 |
| JP | 2006-261149 | 9/2006 |
| WO | WO 2004/066397 | 8/2004 |

* cited by examiner

IGBT SEMICONDUCTOR DEVICE

This application is a national phase application of International Application No. PCT/JP2008/070109, filed Nov. 5, 2008, and claims priority to Japanese Patent Application No. 2007-289536, filed on Nov. 7, 2007, the contents of both of which are hereby incorporated by reference into the present application. The present invention relates to a semiconductor device whose dielectric breakdown strength (voltage resistance) is increased without increasing its resistance while conducting. For example, the present invention relates to an IGBT with low on-voltage and high dielectric breakdown strength, or a diode with low forward voltage drop and high dielectric breakdown strength. In the present specification, "low resistance while conducting" means that forward voltage drop, on-resistance, or on-voltage is low.

TECHNICAL FIELD

Background Art

A semiconductor device is known that comprises a semiconductor substrate which, in a plan view, includes an active region in which a semiconductor element is formed and a peripheral region that surrounds the active region. The phrase "a plan view of the semiconductor substrate" means observing a semiconductor structure built into a semiconductor substrate from a direction perpendicular to a surface of the semiconductor substrate, and is not restricted to a plan view only of an exterior of the semiconductor device. There are semiconductor devices that comprise an active region and a peripheral region that cannot be observed from the exterior.

A semiconductor device which includes the active region and the peripheral region comprises a semiconductor layer of a first conductivity type formed across the active region and the peripheral region. In the case of an IGBT, a drift layer corresponds to this semiconductor layer of the first conductivity type. Different semiconductor structures are built into the active region and the peripheral region respectively at a surface layer side of the semiconductor layer; i.e., a first semiconductor region of a second conductivity type is formed within the active region in a surface layer of the semiconductor layer. In the case of the IGBT, a body region having a conductivity type opposite to that of the drift layer is formed within the active region in a surface layer of the drift layer.

In order to reduce curvature at an edge of a depletion layer extending from the active region to the peripheral region of the semiconductor layer while the semiconductor device is not conducting, a region so-called a guard ring, field limiting ring, or surface RESURF layer may be formed in the peripheral region. These regions contain impurities of the second conductivity type, and surround the first semiconductor region formed in the active region. That is, a second semiconductor region of the second conductivity type may be formed within the peripheral region in the surface layer of the semiconductor layer. Since the second semiconductor region surrounds the first semiconductor region, electric field concentration in the peripheral region is reduced, and the dielectric breakdown strength of the semiconductor device improves. The dielectric breakdown strength of the semiconductor device is improved by forming, in the surface layer of the semiconductor layer in the peripheral region, the second semiconductor region of the second conductivity type that surrounds the first semiconductor region of the second conductivity type. Moreover, the first semiconductor region of the second conductivity type is formed within the active region in the surface layer of the semiconductor layer. In the description below, the second semiconductor region is represented by a guard ring. However, it should be noted that the technique taught in the present specification is not restricted to the guard ring. Further, in the present specification, the guard ring, field limiting ring, or surface RESURF layer may collectively be termed "peripheral voltage-resistant region".

The dielectric breakdown strength of the semiconductor device may also be improved by increasing thickness of the semiconductor layer. However, when the thickness of the semiconductor layer increases, the electrical resistance of the semiconductor device while conducting may increase. There is a trade-off relationship between the dielectric breakdown strength and the electrical resistance of the semiconductor device. Although increasing the thickness of the semiconductor layer improves the dielectric breakdown strength, the electrical resistance while conducting worsens, and although decreasing the thickness of the semiconductor layer improves the electrical resistance while conducting, the dielectric breakdown strength worsens.

As described above, the first semiconductor region may be formed within the active region in the surface layer of the semiconductor layer, and the second semiconductor region may be formed within the peripheral region in the surface layer of the semiconductor layer. In this case, the thickness of the second semiconductor region is often greater than that of the first semiconductor region. The effective thickness of the semiconductor layer that affects the dielectric breakdown strength is defined by a distance between a back surface (or bottom surface) of the first semiconductor region and a back surface (or bottom surface) of the semiconductor layer, and by a distance between a back surface of the second semiconductor region and the back surface of the semiconductor layer. Since the second semiconductor region is thicker than the first semiconductor region, the effective thickness of the semiconductor layer of the peripheral region is smaller than that of the semiconductor layer of the active region.

Consequently, in a conventional semiconductor device that includes the active region and the peripheral region that surrounds the active region, the peripheral region whose semiconductor layer has a smaller effective thickness has a lower breakdown-voltage than the active region whose semiconductor layer has a greater effective thickness. The dielectric breakdown strength in the peripheral region whose semiconductor layer has a smaller effective thickness determines the dielectric breakdown strength of the semiconductor device. If the dielectric breakdown strength in the peripheral region can be improved, the entire dielectric breakdown strength of the semiconductor device can be improved even without improving the dielectric breakdown strength in the active region.

A technique has been developed for preventing the breakdown-voltage in the peripheral region from being lower than that in the active region, and is taught in, e.g., Patent Document 1. A diode (one type of the semiconductor device) of Patent Document 1 comprises a semiconductor layer of the first conductivity type (drift layer), a first semiconductor region of the second conductivity type (anode region), a second semiconductor region of the second conductivity type (guard ring), and a third semiconductor layer. The drift layer is formed across an active region and a peripheral region. The anode region is formed within the active region in a surface layer of the semiconductor layer. The guard ring is formed within the peripheral region in the surface layer of the semiconductor layer. The third semiconductor layer is formed at a back surface side of the drift layer. The third semiconductor layer is of the first conductivity type, and may be called a cathode region. The cathode region is formed across the active region and the peripheral region. The cathode region is thicker at the active region and thinner at the peripheral region. Consequently, a distance between the back surface of the guard ring formed in the peripheral region and the back surface of the drift layer is greater than a distance between the back surface of the anode region and the back surface of the drift layer. That is, the effective thickness of the drift layer in the peripheral region is greater than that of the drift layer in the active region. This type of configuration prevents the breakdown-voltage in the peripheral region from being lower than that in the active region.

Patent Document 1: Japanese Patent Application Publication No. H11(1999)-40822

DISCLOSURE OF INVENTION

However, the method of Patent Document 1 cannot be adopted in the IGBT. In the case of the IGBT, the buffer layer is formed at the back surface of the semiconductor layer (drift layer), thereby to prevent the depletion layer from extending to the collector layer. The buffer layer includes impurities of the same conductivity type as that of the drift layer, at a higher concentration than the drift layer. If the technique of Patent Document 1, in which the thickness of the buffer layer in the active region is increased and its thickness in the peripheral region is decreased, is applied, the on-voltage of the IGBT may increase. If the thickness of the buffer layer is increased, the efficiency of injecting carriers from the collector layer into the drift layer may decrease. If the thickness of the buffer layer is increased in the active region, the efficiency of injecting carriers may decrease and the on-voltage may increase. One problem to be solved by the present invention is to provide an IGBT in which the dielectric breakdown strength is improved without increasing the on-voltage.

One technique taught in the present specification makes the thickness of the drift layer in the peripheral region to be greater than that of the drift layer in the active region. Further, the amount of carriers injected into the drift layer is suppressed more in the peripheral region than in the active region. These two operations improve the dielectric breakdown strength of the peripheral region.

The IGBT taught in the present specification comprises a semiconductor substrate which, in a plan view, includes an active region in which an IGBT element is formed and a peripheral region that surrounds the active region. The IGBT comprises a drift layer of a first conductivity type, a body region of a second conductivity type, a peripheral voltage-resistant region of the second conductivity type, and a collector layer of the second conductivity type. The drift layer is formed across the active region and the peripheral region. The body region is formed within the active region in a surface layer of the drift layer. The peripheral voltage-resistant region is formed within the peripheral region in the surface layer of the drift layer, the peripheral voltage-resistant region surrounding the body region. The collector layer is formed at a back surface side of the drift layer, the collector layer being formed across the active region and the peripheral region. In this IGBT, a thickness of the collector layer in the peripheral region is smaller than that in the active region, and a distance between a back surface of the peripheral voltage-resistant region and the back surface of the drift layer is greater than that between a back surface of the body region and the back surface of the drift layer.

In this IGBT, the thickness of the collector layer in the peripheral region is smaller than that in the active region. Consequently, the effective thickness of the drift layer in the peripheral region is greater than that of the drift layer in the active region even if the back surface (bottom surface) of the body region and the back surface (bottom surface) of the peripheral voltage-resistant region are at the same depth. Since the effective thickness of the drift layer in the peripheral region is greater, the dielectric breakdown strength of the peripheral region improves.

In the IGBT in general, carriers are injected from the collector layer into the drift layer. If the thickness of the collector layer in the active region is greater than that in the peripheral region, majority of the carriers is injected into the active region, and the amount of carriers injected into the peripheral region decreases. Since the majority of the carriers is injected into the active region, the on-voltage of the IGBT will not increase. In the IGBT, when changing from an on to an off state, the carriers are emitted from the drift layer into the collector layer, and the carriers are emitted from the drift layer into a source region. When many carriers have accumulated in the drift layer of the peripheral region, the carriers that accumulated in the drift layer of the peripheral region may have a concentrated flow at a specific location within the drift layer when being emitted, and thus, the semiconductor may be destroyed at the location of the concentrated flow. In the IGBT based on the technique taught in the present specification, the amount of carriers injected into the peripheral region is suppressed. Consequently, excessively concentrated flow may not readily occur when the IGBT changes from the on to the off state.

In the IGBT taught in the present specification, a high dielectric breakdown strength is obtained because the effective thickness of the drift layer in the peripheral region is greater and the amount of carriers injected into the peripheral region is suppressed. In this IGBT, the dielectric breakdown strength can be improved without increasing the on-voltage.

In the IGBT taught in the present specification, it is preferred that the thickness of the peripheral voltage-resistant region is greater than that of the body region. A configuration in which a distance between the back surface of the peripheral voltage-resistant region and the back surface of the drift layer is greater than a distance between the back surface of the body region and the back surface of the drift layer can be realized merely by making the thickness of the peripheral voltage-resistant region to be smaller than that of the body region. However, it is preferred that the thickness of the peripheral voltage-resistant region is at least greater than that of the body region, in order to reduce the curvature of the depletion layer in the peripheral region.

The thickness of the collector layer in the peripheral region being smaller than that in the active region has the following effects: this type of structure can realize a relationship wherein the distance between the back surface of the peripheral voltage-resistant region and the back surface of the drift layer is greater than that between the back surface of the body region and the back surface of the drift layer, even though the thickness of the peripheral voltage-resistant region is greater than that of the body region.

It is preferred that the back surface of the drift layer in the active region is recessed further inward than the back surface of the drift layer in the peripheral region. Alternatively, it is preferred that a surface of the body region is recessed further inward than a surface of the peripheral voltage-resistant region. Recessing the back surface of the drift layer in the active region further inward than the back surface of the drift layer in the peripheral region is suitable, and so too is recessing the surface of the body region further inward than the surface of the peripheral voltage-resistant region. If either of the above conditions are satisfied, a relationship can be realized wherein the distance between the back surface of the peripheral voltage-resistant region and the back surface of the drift layer is greater than that between the back surface of the body region and the back surface of the drift layer even though the thickness of the peripheral voltage-resistant region is greater than that of the body region.

One technique taught in the present specification improves the dielectric breakdown strength in the peripheral region without increasing the on-voltage by suppressing the amount of carriers of the second conductivity type injected from the collector layer into the drift layer to a greater extent in the peripheral region than in the active region. The IGBT based on the technique taught in the present specification comprises the buffer layer between the drift layer and the collector layer. The buffer layer is formed across the peripheral region and the active region, and contains impurities of the first conductivity type in a concentration higher than that of the impurities in the drift layer. Further, it is preferred that the thickness of the buffer layer in the peripheral region is greater than that in the active region. Alternatively, it is preferred that the impurity concentration in the buffer layer in the peripheral region is greater than that in the buffer layer in the active region. The thickness of the buffer layer in the peripheral region may be greater than that in the active region, simultaneously with the impurity concentration in the buffer layer in the peripheral region being greater than that in the active region.

The buffer layer suppresses the number of carriers injected from the collector layer into the drift layer. The number of carriers injected into the drift layer in the peripheral region can be suppressed by increasing the thickness of the buffer layer in the peripheral region or by increasing the impurity concentration in the buffer layer in the peripheral region. This type of configuration can improve the dielectric breakdown strength of the peripheral region. In the active region, a sufficient number of carriers is injected into the drift layer because the thickness of the buffer layer is smaller or its impurity concentration is smaller. The on-voltage of the IGBT will not increase. Meanwhile, the buffer layer may be called a field stop layer.

The relationship wherein the thickness of the peripheral voltage-resistant region is greater than that of the body region and distance from the back surface of the peripheral voltage-resistant region to the back surface of the drift layer is greater than the distance from the back surface of the body region to the back surface of the drift layer is also useful in a semiconductor device other than the IGBT (e.g. a diode or FET). Generally, a decrease in the dielectric breakdown strength of the peripheral region can be prevented if the thickness of the second semiconductor region (e.g. peripheral voltage-resistant region) of the first conductivity type formed within the peripheral region in the surface layer of the semiconductor layer is greater than the thickness of the first semiconductor region (e.g. body region) of the first conductivity type formed within the active region in the surface layer of the semiconductor layer (e.g. drift layer), and if the distance from the back surface of the second semiconductor region to the back surface of the semiconductor layer is greater than the distance from the back surface of the first semiconductor region to the back surface of the semiconductor layer.

Another technique taught in the present specification realizes a semiconductor device that prevents a decrease in the dielectric breakdown strength in the peripheral region. The other semiconductor device realized by the technique taught in the present specification is a semiconductor device which includes an active region and a peripheral region, the semiconductor device comprising a semiconductor layer of a first conductivity type, a first semiconductor region of a second conductivity type, and a second semiconductor region of the second conductivity type. The semiconductor layer of the first conductivity type is formed across the active region and the peripheral region. The first semiconductor region is formed within the active region in a surface layer of the semiconductor layer. The second semiconductor region is formed within the peripheral region in the surface layer of the semiconductor layer, the second semiconductor region surrounding the first semiconductor region. In this semiconductor device, a surface of the first semiconductor region is recessed further inward than a surface of the second semiconductor region. Further, in this semiconductor device, thickness of the second semiconductor region is greater than that of the first semiconductor region, and distance between a back surface of the second semiconductor region and a back surface of the semiconductor layer is greater than distance between a back surface of the first semiconductor region and the back surface of the semiconductor layer.

By recessing the surface of the first semiconductor region further inward than the surface of the second semiconductor region, this semiconductor device realizes a relationship wherein the distance between the back surface of the second semiconductor region and the back surface of the semiconductor layer is greater than the distance between the back surface of the first semiconductor region and the back surface of the semiconductor layer, even while the thickness of the second semiconductor region is made greater than that of the first semiconductor region. Curvature of the depletion layer in the peripheral region can be reduced by making the thickness of the second semiconductor region greater than that of the first semiconductor region. Simultaneously, the dielectric breakdown strength of the peripheral region is improved by making the effective thickness of the semiconductor layer in the peripheral region greater.

This semiconductor device may be realized as a transistor (IGBT, etc.) in which a third semiconductor layer of the second conductivity type is formed at a back surface side of the semiconductor layer. This semiconductor device is also suitable for being realized in a device not comprising a third semiconductor layer, e.g. a diode consisting of a pn junction between the first semiconductor region and the semiconductor layer.

According to the technique taught in the present specification, a semiconductor device with increased dielectric breakdown strength in the peripheral region can be realized without increasing the on-resistance.

EMBODIMENTS OF THE INVENTION

First Embodiment

Figure 1:
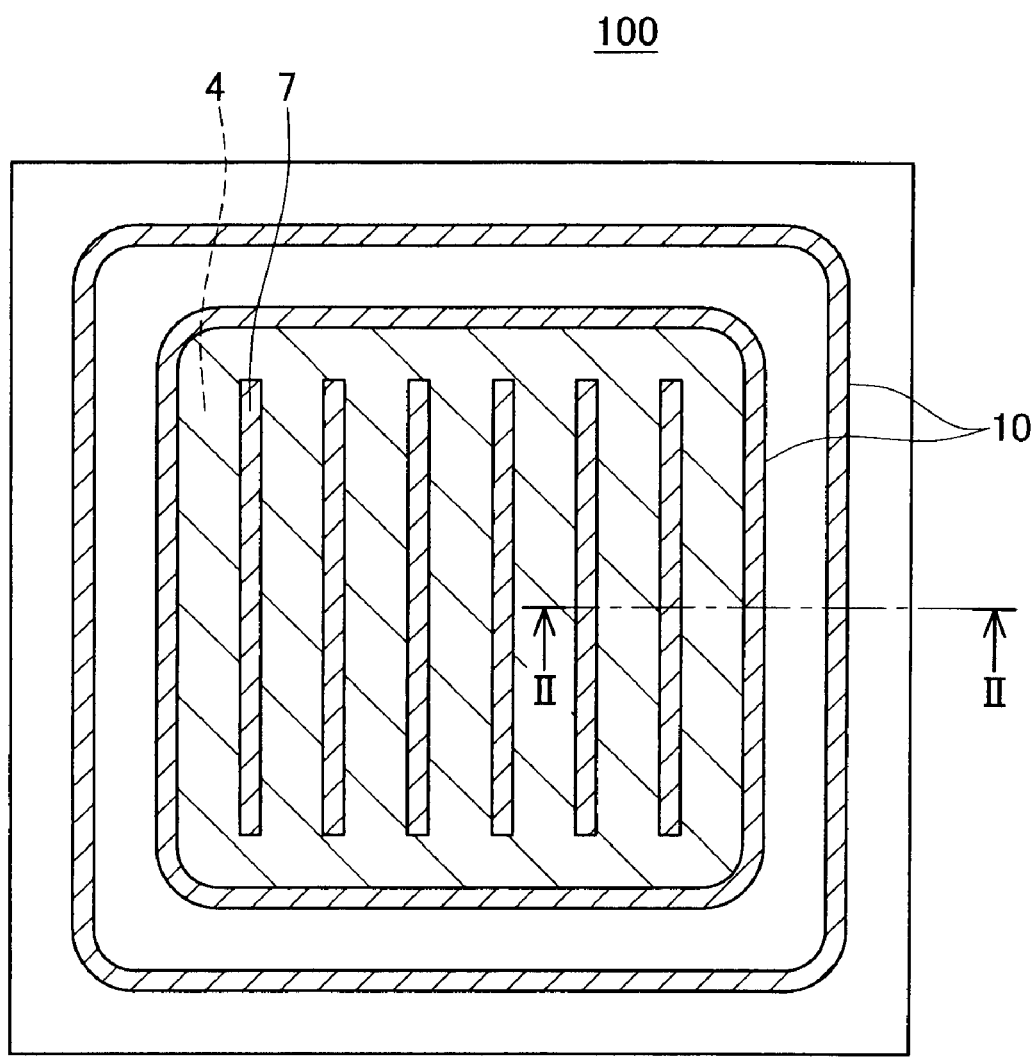
FIG. 1 shows a schematic plan view of a semiconductor device of the first embodiment.
Figure 2:
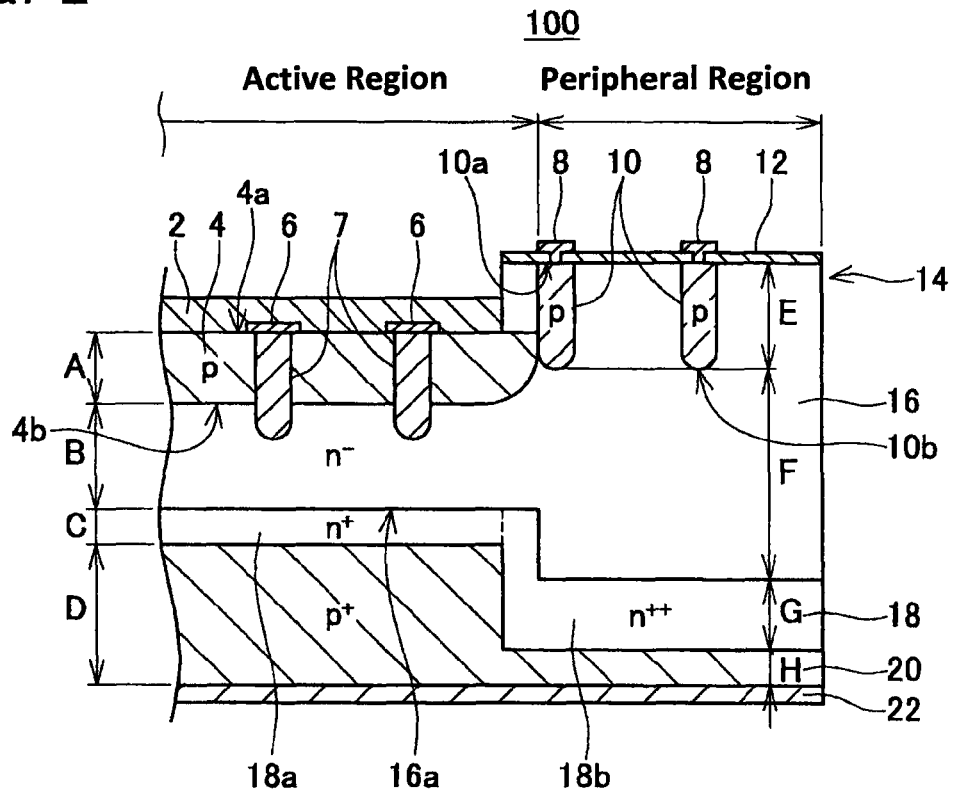
FIG. 2 shows a schematic cross-sectional view of the semiconductor device of the first embodiment.

A semiconductor device of the first embodiment will be explained with reference to FIGS. 1, 2. The semiconductor device of the present embodiment is an example in which the present invention has been applied to an IGBT. FIG. 1 is a schematic plan view of an IGBT 100. FIG. 2 is a schematic cross-sectional view of the IGBT 100 viewed along the line II-II of FIG. 1.

First, an outline of the configuration of the IGBT 100 will be given. The IGBT 100 is formed on a semiconductor substrate 14. Below, the "semiconductor substrate 14" is termed simply "substrate 14". A metal collector electrode 22 is formed on a back surface of the substrate 14. A $p^+$-type collector layer 20 (third semiconductor layer) is formed on an upper surface of the collector electrode 22, i.e. on a bottom layer of the substrate 14. An n-type buffer layer 18 (high impurity concentration layer) is formed on the collector layer 20. The concentration of the n-type impurities in the buffer layer 18 will be described later. An $n^-$-type drift layer 16 (semiconductor layer) is formed on the buffer layer 18. The concentration of the n-type impurities in the buffer layer 18 is greater than that of the drift layer 16.

A p-type body region 4 (first semiconductor region) is formed within a range of a part of a surface layer of the drift layer 16 (the upper surface side of the drift layer 16 in FIG. 1). A p-type guard ring 10 (second semiconductor region) is formed within another range of the surface layer of the drift layer 16. As shown in FIG. 1, the guard ring 10 surrounds the body region 4. Two guard rings 10 are formed in the substrate 14. The two guard rings 10 doubly surround the body region 4. The number of guard rings is not restricted to two, but may be one, or three, or more.

The region formed in the body region 4 of the substrate 14 corresponds to an active region. The region that surrounds the body region 4 corresponds to a peripheral region. The guard rings 10 are formed in the peripheral region.

A plurality of trenches 7 are formed in the active region, these trenches 7 passing through the body region 4 and reaching a drift layer. Although not shown, an insulating layer is formed at an inner wall of each trench 7, and an inner side thereof is filled with a conductive material. The conductive material within the trench 7 forms a gate electrode. An insulating layer 6 is formed on an upper surface of the trench 7. An emitter electrode 2 is formed on a surface 4a of the body region 4. Meanwhile, the emitter electrode 2 and the conductive material within the trench 7 are insulated by the insulating layer 6. Although not shown, n-type emitter regions that contact with the emitter electrode 2 are formed at both sides of each trench 7. A p-type body contact region is formed between two n-type emitter regions. The body region 4 is conductive with the emitter electrode 2 via the body contact region. Further, although not shown, gate wirings that are connected with the gate electrodes filled inside the trenches 7 are formed at the surface of the substrate 14.

An IGBT element is constructed by the collector layer 20, the buffer layer 18, a drain layer 16, the body region 4, the emitter region (not shown), and the gate electrode within the trench 7. The IGBT element (semiconductor element) is formed in the active region. In other words, in a plan view of the substrate 14, the IGBT 100 is partitioned into the active region in which the semiconductor element is formed, and the peripheral region that surrounds the active region.

The surface of the substrate 14 in the peripheral region is covered by an oxide film 12. Field plates 8 that pass through the oxide film 12 and make contact with the guard rings 10 respectively are formed on an upper surface of the oxide film 12.

Next, characteristics of the IGBT 100 will be explained.

(Characteristic 1) A thickness H of the collector layer 20 in the peripheral region is smaller than a thickness D of the collector layer 20 in the active region. By making the thickness of the collector layer 20 smaller in the peripheral region, the number of carriers injected from the collector layer 20 into the drift layer 16 of the peripheral region can be made smaller than the number of carriers injected from the collector layer 20 into the drift layer 16 of the active region. Meanwhile, in this embodiment, the carriers injected from the collector layer 20 into the drift layer 16 of the peripheral region are holes.

Further, a distance F from a back surface 10b of the guard ring 10 to a back surface 16a of the drift layer 16 is greater than a distance B from a back surface 4b of the body region 4 to the back surface 16a of the drift layer 16. Below, the distance F may be termed "the effective thickness F of the drift layer 16 in the peripheral region". Further, the distance B may be termed "the effective thickness B of the drift layer 16 in the active region". The effective thickness F of the drift layer 16 in the peripheral region is greater than the effective thickness B of the drift layer 16 in the active region.

In the IGBT 100, the effective thickness of the drift layer 16 is greater in the peripheral region than in the active region, and the number of injected carriers (minority carriers) is suppressed. The density of the minority carriers accumulated in the drift layer 16 can thereby be made smaller in the peripheral region than in the active region. Consequently, the IGBT 100 can reduce the current density flowing transiently through the peripheral region when changing from the on to the off state. Further, the IGBT 100 can maintain the potential difference in the drift layer 16 having a greater effective thickness in the peripheral region, and suppress the electric field concentration. That is, the IGBT 100 can improve the dielectric breakdown strength of the peripheral region. In the active region, the thickness of the collector layer 20 is greater and the effective thickness of the drift layer 16 is smaller than in the peripheral region. Thereby, since a sufficient number of carriers is injected into the drift layer 16 that has a smaller thickness in the active region when the IGBT 100 changes to the on state, the on-voltage is not increased.

(Characteristic 2) A thickness E of the guard ring 10 is greater than a thickness A of the body region 4. By making thickness of the guard ring 10 greater than thickness of the body region 4, the curvature in the depletion layer in the peripheral region can be reduced. This characteristic also contributes to improving the dielectric breakdown strength of the peripheral region.

(Characteristic 3) The back surface 16a of the drift layer 16 is recessed further inward in the active region than in the peripheral region. This characteristic contributes to both the thickness E of the guard ring 10 being greater than the thickness A of the body region 4, and to the effective thickness of the drift layer 16 being greater in the peripheral region than in the active region.

(Characteristic 4) The surface 4a of the body region 4 is recessed further inward than a surface 10a of the guard ring 10. This characteristic, as well, contributes to both the thickness E of the guard ring 10 being greater than the thickness A of the body region 4, and to the effective thickness of the drift layer 16 being greater in the peripheral region than in the active region. Meanwhile, the recess of the body region 4 may be formed by processing such as etching, etc.

(Characteristic 5) The concentration of n-type impurities in the buffer layer 18b in the peripheral region is greater than that in the buffer layer 18a in the active region. As described above, the concentration of n-type impurities in the buffer layer 18 is greater than the impurity concentration in the drift layer 16. Consequently, the drift layer 16 is $n^-$-type, the buffer layer 18a in the active region is $n^+$-type, and the buffer layer 18b in the peripheral region is $n^{++}$-type.

(Characteristic 6) A thickness G of the buffer layer 18b in the peripheral region is greater than a thickness C of the buffer layer 18a in the active region. The thicker the buffer layer 18 or the higher its n-type impurity concentration, the greater the suppression of the number of minority carriers that passes through. Consequently, characteristics 5 and 6 suppress the efficiency with which the carriers are injected from the collector layer 20 into the drift layer 16 of the peripheral region. By suppressing the number of carriers injected into the peripheral region, the dielectric breakdown strength of the peripheral region can be improved.

The buffer layer 18 that has a greater impurity concentration than the drift layer 16 realizes greater dielectric breakdown strength than the drift layer 16 with the same thickness. Consequently, the dielectric breakdown strength is improved more in the peripheral region than in the active region by making the thickness of the buffer layer 18 greater in the peripheral region than in the active region, and by making the impurity concentration of the buffer layer greater in the peripheral region than in the active region.

By making the thickness of the buffer layer 18 greater in the peripheral region than in the active region, and by making the impurity concentration of the buffer layer greater in the peripheral region than in the active region, the dielectric breakdown strength in the peripheral region can be improved without increasing the on-voltage.

As described above, in the IGBT 100, the dielectric breakdown strength in the peripheral region can be improved without increasing the on-resistance by means of the characteristics 1 to 6.

In the IGBT 100, the dielectric breakdown strength in the peripheral region is improved. Compared with a conventional IGBT, the phenomenon of the dielectric breakdown will consequently occur more readily in the active region than in the peripheral region. The active region is originally designed to withstand large currents. Consequently, if the dielectric breakdown will occur in the active region, the semiconductor device can avoid destruction to the point of unrecoverability.

The following technical concept is realized by the characteristic of the thickness H of the collector layer 20 in the peripheral region being smaller than the thickness D of the collector layer 20 in the active region, and by the characteristics 5 and 6 above. The amount of second conductivity type carriers injected into the drift layer 16 of the peripheral region per unit area (the amount of carriers injected from the collector layer) is smaller than the amount of second conductivity type carriers injected into the drift layer 16 of the active region per unit area. Meanwhile, the characteristics 5 and 6 each independently have the effect of improving the dielectric breakdown strength.

Second Embodiment

Figure 3:
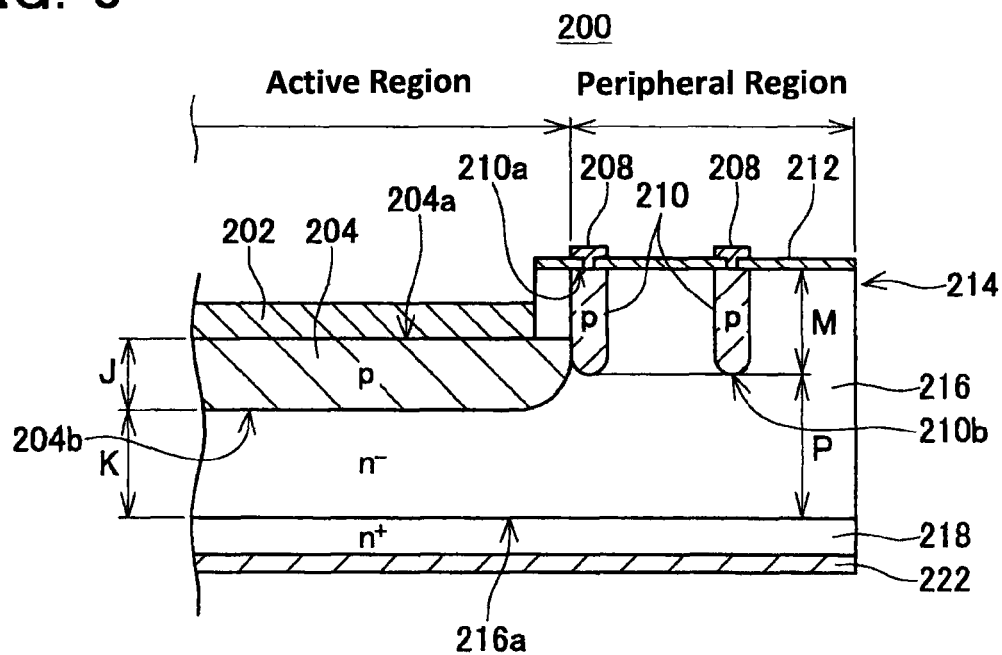
FIG. 3 shows a schematic cross-sectional view of a semiconductor device of the second embodiment.

Next, a semiconductor device of the second embodiment will be explained with reference to FIG. 3. The semiconductor device of the present embodiment is a diode. FIG. 3 is a schematic cross-sectional view of a diode 200 of the second embodiment.

The diode 200 is formed on a semiconductor substrate 214 (termed substrate 214 below). A metal cathode electrode 222 is formed on a back surface of the substrate 214. An $n^+$-type cathode region 218 (high impurity concentration layer) is formed on the cathode electrode 222. I.e., the high impurity concentration layer 218 is formed on a bottom layer of the substrate 214. An n-type semiconductor layer 216 is formed on the high impurity concentration layer 218.

A p-type anode region 204 (first semiconductor region) is formed within a range of a part of a surface layer of the semiconductor layer 216 (in FIG. 3, an upper surface side of the semiconductor layer 216). A p-type guard ring 210 (second semiconductor region) that surrounds an anode region 204 in double is formed within another range of the surface layer of the semiconductor layer 216. Meanwhile, a plan view of the diode 200 corresponds to FIG. 1 in which the body region 4 is replaced by the anode region 204 and the trenches 7 have been eliminated.

In the substrate 214, the region in which the anode region 204 is formed corresponds to an active region. The region surrounding the active region corresponds to a peripheral region. The guard ring 210 is formed in the peripheral region. In a plan view of the substrate 214, the diode 200 is partitioned into the active region in which the semiconductor element is formed, and the peripheral region that surrounds the active region. An anode electrode 202 is formed on a surface 204a of the anode region 204.

The surface of the substrate 214 in the peripheral region is covered by an oxide film 212. Field plates 208 that pass through the oxide film 212 and make contact with the guard rings 210 are formed on an upper surface of the oxide film 212.

Next, characteristics of the diode 200 will be explained. (Characteristic 1) A distance P between a back surface 210b of the guard ring 210 and a back surface 216a of the semiconductor layer 216 is greater than a distance K between a back surface 204b of the anode region 204 and the back surface 216a of the semiconductor layer 216. Below, the distance P may be termed "effective thickness P of the semiconductor layer 216 in the peripheral region". Further, the distance K may be termed "effective thickness K of the semiconductor layer 216 in the active region". In the diode 200, the effective thickness P of the semiconductor layer 216 in the peripheral region is greater than the effective thickness K of the semiconductor layer 216 in the active region.

In the diode 200, the effective thickness of the semiconductor layer 216 is greater in the peripheral region than in the active region. Consequently, space for a depletion layer to expand can be increased more in the peripheral region than in the active region. The dielectric breakdown strength of the peripheral region will thereby be improved. The thickness of the semiconductor layer 216 is smaller in the active region than in the peripheral region. The forward voltage drop is thereby not increased in the diode 200 when a positive voltage is applied.

(Characteristic 2) A thickness M of the guard ring 210 is greater than a thickness J of the anode region 204. By making the guard ring 210 thicker than the anode region 204, the curvature of the depletion layer in the peripheral region will be eased. The dielectric breakdown strength of the peripheral region is improved by this as well.

(Characteristic 3) The surface 204a of the anode region 204 is recessed further inward than a surface 210a of the guard ring 210. This characteristic contributes to both the thickness M of the guard ring 210 being greater than the thickness J of the anode region 204, and to the effective thickness of the semiconductor layer 216 being greater in the peripheral region than in the active region. Meanwhile, the recess of the anode region 204 may be formed by processing such as etching, etc.

In the diode 200, the dielectric breakdown strength in the peripheral region can be improved without increasing the forward voltage drop by means of the characteristics 1 to 3.

Specific examples of the present invention are described above in detail, but these merely illustrate some possibilities of the teachings and do not restrict the scope of the claims. The art set forth in the claims includes variations and modifications of the specific examples set forth above.

For example, in the above embodiments, the semiconductor device comprises two guard rings. The number of guard rings may be one, or may be three or more. Further, in the above embodiments, the second semiconductor region is the guard ring. However, the second semiconductor region may be a field limiting, or a surface RESURF layer. Further, the present invention is not restricted to a trench type semiconductor device. The present invention is also suitable for a planar type semiconductor device, e.g., a planar type IGBT.

Further, the technical elements disclosed in the specification or the drawings have technical utility separately or in all types of combinations, and are not limited to the combinations set forth in the claims at the time of filing of the application. Furthermore, the art disclosed in the specification or the drawings may be utilized to simultaneously achieve a plurality of aims, and has technical utility by achieving any one of these aims.

The invention claimed is:

1. An IGBT comprising a semiconductor substrate partitioned, in a plan view, into an active region in which an IGBT element is formed and a peripheral region that surrounds the active region in the plan view, the IGBT comprising:
   a drift layer of a first conductivity type formed across the active region and the peripheral region;
   a body region of a second conductivity type formed within the active region in a surface layer of the drift layer;
   a peripheral voltage-resistant region of the second conductivity type formed within the peripheral region in the surface layer of the drift layer, the peripheral voltage-resistant region surrounding the body region in the plan view;
   a collector layer of the second conductivity type formed at a back surface side of the drift layer, the collector layer being formed across the active region and the peripheral region; and
   a buffer layer formed between the back surface of the drift layer and the collector layer, the buffer layer containing impurities of the first conductivity type in a concentration greater than that of the impurities in the drift layer;
   wherein:
   a thickness of the collector layer in the peripheral region is smaller than that in the active region;
   a distance between a back surface of the peripheral voltage-resistant region and the back surface of a portion of the drift layer formed in the peripheral region is greater than that between a back surface of the body region and the back surface of a portion of the drift layer formed in the active region; and
   the impurity concentration in the buffer layer in the peripheral region is greater than that in the buffer layer in the active region.

2. The IGBT of claim 1, wherein a thickness of the peripheral voltage-resistant region is greater than that of the body region.

3. The IGBT of claim 1, wherein the back surface of the drift layer in the active region is recessed further inward than the back surface of the drift layer in the peripheral region.

4. The IGBT of claim 1, wherein a surface of the body region is recessed further inward than a surface of the peripheral voltage-resistant region.

5. The IGBT of claim 1, wherein a thickness of the buffer layer in the peripheral region is greater than that in the active region.

6. An IGBT comprising a semiconductor substrate partitioned, in a plan view, into an active region in which an IGBT element is formed and a peripheral region that surrounds the active region in the plan view, the IGBT comprising:
   a drift layer of a first conductivity type formed across the active region and the peripheral region;
   a body region of a second conductivity type formed within the active region in a surface layer of the drift layer;
   a peripheral voltage-resistant region of the second conductivity type formed within the peripheral region in the surface layer of the drift layer, the peripheral voltage-resistant region surrounding the body region in the plan view;
   a buffer layer formed at a back surface side of the drift layer, the buffer layer being formed across the active region and the peripheral region, and containing impurities of the first conductivity type in a concentration greater than that of the impurities in the drift layer; and
   a collector layer of the second conductivity type formed at a back surface side of the buffer layer, the collector layer being formed across the active region and the peripheral region;
   wherein a number per unit area of carriers of the second conductivity type injected from the collector layer into the drift layer in the peripheral region is smaller than that in the active region; and
   wherein the impurity concentration in the buffer layer in the peripheral region is greater than that in the active region.

7. The IGBT of claim 6, wherein a thickness of the buffer layer in the peripheral region is greater than that in the active region.

* * * * *